US012635102B2

(12) United States Patent
Fan et al.

(10) Patent No.: US 12,635,102 B2
(45) Date of Patent: May 19, 2026

(54) DUAL-INVERTER ASSEMBLY

(71) Applicant: Delta Electronics, Inc., Taoyuan City (TW)

(72) Inventors: Kang-Yu Fan, Taoyuan City (TW); Jhih-Yang Li, Taoyuan City (TW); Hsing-Yu Wu, Taoyuan City (TW)

(73) Assignee: Delta Electronics, Inc., Taoyuan City (TW)

( * ) Notice: Subject to any disclaimer, the term of this patent is extended or adjusted under 35 U.S.C. 154(b) by 433 days.

(21) Appl. No.: 18/209,748

(22) Filed: Jun. 14, 2023

(65) Prior Publication Data

US 2024/0341052 A1 Oct. 10, 2024

(30) Foreign Application Priority Data

Apr. 6, 2023 (CN) .......................... 202310360012.4

(51) Int. Cl.
H01R 25/16 (2006.01)
H02M 7/00 (2006.01)
(Continued)

(52) U.S. Cl.
CPC ......... H05K 7/14322 (2022.08); H01R 25/16 (2013.01); H02M 7/003 (2013.01); (Continued)

(58) Field of Classification Search
CPC ........... H05K 7/14322; H05K 7/20663; H05K 7/20927; H05K 7/14329; H05K 7/20272; (Continued)

(56) References Cited

U.S. PATENT DOCUMENTS 4,920,475 A    4/1990 Rippel
8,169,780 B2   5/2012 Yoshino et al.
(Continued)

FOREIGN PATENT DOCUMENTS

CN    101859958 B    10/2013
CN    109889058    *  6/2019    .............. H02M 7/00
(Continued)

*Primary Examiner* — Crystal L Hammond
*Assistant Examiner* — Jonathan Walter Soileau
(74) *Attorney, Agent, or Firm* — KIRTON McCONKIE; Evan R. Witt

(57) ABSTRACT

A dual-inverter assembly is disclosed and includes an elongated base, a first power module, a second power module, an input copper busbar and two output copper busbars. The elongated base includes a first elongated sidewall and a second elongated sidewall opposite to each other and extended along a first direction. The first power module and the second power module are disposed on a first side and a second side of the elongated base along the first direction, respectively. The input copper busbar is spatially corresponding to the first elongated sidewall, and electrically connected to the first power module and the second power module. The two output copper busbars are spatially corresponding to the second elongated sidewall, and electrically connected to the first power module and the second power module, respectively, so as to achieve an optimized configuration.

20 Claims, 13 Drawing Sheets

(51) Int. Cl.

| | |
|---|---|
| *H05K 7/14* | (2006.01) |
| *H05K 7/20* | (2006.01) |
| *H02M 3/00* | (2006.01) |
| *H02P 27/06* | (2006.01) |

(52) U.S. Cl.
CPC ..... *H05K 7/14329* (2022.08); *H05K 7/20663* (2013.01); *H05K 7/20927* (2013.01); *H02M 3/003* (2021.05); *H02P 27/06* (2013.01)

(58) Field of Classification Search
CPC ...... H02M 7/003; H02M 7/42; H02M 1/0067; H02M 3/003; H01R 25/16; H02P 27/06
See application file for complete search history.

(56) References Cited

U.S. PATENT DOCUMENTS

| | | | | |
|---|---|---|---|---|
| 9,190,933 | B2 * | 11/2015 | Yamaura | ............... H02M 7/003 |
| 10,411,387 | B2 | 9/2019 | Nishida et al. | |

| | | | |
|---|---|---|---|
| 2004/0228094 | A1 | 11/2004 | Ahmed et al. |
| 2005/0041055 | A1 | 2/2005 | Silverbrook |
| 2005/0118744 | A1 | 6/2005 | Ishiguro et al. |
| 2015/0188249 | A1 | 7/2015 | Pereira |
| 2017/0301600 | A1 | 10/2017 | Frank et al. |
| 2018/0337108 | A1 | 11/2018 | Walter |
| 2020/0352041 | A1 | 11/2020 | Bulovic et al. |
| 2022/0200467 | A1 | 6/2022 | Andris et al. |

FOREIGN PATENT DOCUMENTS

| | | | | |
|---|---|---|---|---|
| CN | 109889058 | A | 6/2019 | |
| CN | 108475869 | B | 1/2020 | |
| CN | 111448749 | A | 7/2020 | |
| CN | 113241956 | A | 8/2021 | |
| CN | 218477417 | U | 2/2023 | |
| DE | 102008034663 | A1 | 2/2009 | |
| DE | 102021202552 | A1 * | 9/2022 | ........... H01L 23/473 |
| TW | I445292 | B | 7/2014 | |
| TW | I513167 | B | 12/2015 | |
| TW | 202131617 | A | 8/2021 | |

* cited by examiner

1a

70

42a

40a

42b

12

40b

11

10

1a

16

31

32

310

320

60

61

DUAL-INVERTER ASSEMBLY

CROSS-REFERENCE TO RELATED APPLICATION

This application claims priority to China Patent Application No. 202310360012.4, filed on Apr. 6, 2023. The entire contents of the above-mentioned patent application are incorporated herein by reference for all purposes.

FIELD OF THE INVENTION

The present disclosure relates to an electronic assembly structure, and more particularly to a dual-inverter assembly integrating elongated power modules in a limited space by a single-input and dual-output manner, so as to improve the entire space utilization.

BACKGROUND OF THE INVENTION

A traction inverter for the vehicle motor usually includes three high-power modules arranged in a line to form an elongated structure. The high-efficiency power modules used in the inverter are often accompanied with a lot of heat generated therefrom, and must be combined with a water-cooled heat dissipation assembly to achieve an effective effect of heat dissipation. However, the water-cooled heat dissipation assembly combined therewith is designed as a single-sided cooling channel. The heat dissipation assembly has one side thermally coupled to the three high-power modules, and another side provided for the outlet and the inlet of the cooling channel. The assembly structure of the inverter is not easy to optimize the space utilization and improve the entire space utilization.

On the other hand, in a stacked dual-inverter assembly, since the design of the conventional heat dissipation assembly with the single-sided cooling channel will take up more space, it is not conducive to the overall space configuration of the stacked inverter. The input terminal and the output terminal of each inverter need to avoid the water outlet and water inlet of the cooling flow channel. Moreover, the two sets of output terminals of the dual inverters are connected to the two power modules, respectively, and further connected to a load end in the limitation of the connection direction. How to optimize the stacked dual-inverter assembly and improve the space utilization has always been a major subject in the art.

Therefore, there is a need of providing a dual-inverter assembly integrating elongated power modules in a limited space by a single-input and dual-output manner, so as to improve the entire space utilization and obviate the drawbacks encountered by the prior arts.

SUMMARY OF THE INVENTION

An object of the present disclosure is to provide a dual-inverter assembly integrating elongated power modules in a limited space by a single-input and dual-output manner, so as to improve the entire space utilization.

Another object of the present disclosure is to provide a dual-inverter assembly. Two power modules are stacked up and down on an elongated base, one DC input copper busbar is integrated from the bottom to one elongated sidewall and then electrically connected to the two power modules, and two AC output copper busbars are electrically connected from another elongated sidewall to the two power modules, respectively, and then led to the top for integration. It facilitates to integrate the utilization of the upper and lower spaces of the stacked structure effectively. When a bulk capacitor is stacked above the dual-inverter assembly, it allows to minimize the distance between the bulk capacitor and the two power modules, and make the distances from the bulk capacitor to the power devices of each power module as consistent as possible. The cooling flow channel disposed in the interior of the elongated base has the inlet and the outlet leading through the lower space, and serves as a cooling structure for two power modules and the bulk capacitors. The two AC output copper busbars, which are limited by the connection direction of the load end, have the respective elastic component disposed thereof to provide the appropriate elastic force to keep the output copper busbars firmly in contact with the load. On the other hand, it allows to arrange the control circuit board for the dual-inverter assembly under the assembly structure to take full advantage of the lower space. Thus, it facilitates the dual-inverter assembly to achieve an optimal configuration in a limited space by a single-input and dual-output manner, and the entire space utilization is improved.

In accordance with an aspect of the present disclosure, a dual-inverter assembly is provided and includes a n elongated base, a first power module, a second power module, an input copper busbar and two output copper busbars. The elongated base includes comprises a first side, a second side, a first elongated sidewall and a second elongated sidewall. The first side and the second side are opposite to each other, and the first elongated sidewall and the second elongated sidewall are opposite to each other and extended along a first direction. The first power module is arranged along the first direction and disposed on the first side. The second power module is arranged along the first direction and disposed on the second side. The input copper busbar is spatially corresponding to the first elongated sidewall, partially extended toward the first side and the second side from the first elongated sidewall, and includes a first connection portion disposed on the first elongated sidewall and electrically connected to the first power module and the second power module. The input copper busbar is a DC input copper busbar including a positive input copper busbar and a negative input copper busbar, which are spatially corresponding to the first elongated sidewall. The two output copper busbars are spatially corresponding to the second elongated sidewall and partially extended toward the first side and the second side from the second elongated sidewall. The two output copper busbars are served as two AC output copper busbars, each of the two output copper busbars includes a second connection portion disposed adjacent to the second elongated sidewall, one of the second connection portion of the two output copper busbars is electrically connected to an output contact terminal of the first power module along the first side, and another one of the second connection portion of the two output copper busbars is electrically connected to an output contact terminal of the second power module along the second side.

In an embodiment, the positive input copper busbar includes a positive attaching section, the negative input copper busbar includes a negative attaching section, and the positive attaching section and the negative attaching section are spatially parallel to the first elongated sidewall.

In an embodiment, the positive input copper busbar includes a positive input port connected to the positive attaching section, the negative input copper busbar includes a negative input port connected to the negative attaching section, and the positive input port and the negative input port re arranged in parallel to each other.

In an embodiment, the positive input copper busbar includes a plurality of positive input connection pins spatially corresponding to the first side and the second side, connected in parallel through the positive attaching section, and electrically connected to the first power module and the second power module.

In an embodiment, the negative input copper busbar includes a plurality of negative input connection pins, spatially corresponding to the first side and the second side, connected in parallel through the negative attaching section, and electrically connected to the first power module and the second power module.

In an embodiment, the plurality of positive input connection pins and the plurality of negative input connection pins are misaligned with each other in a viewing direction from the first side to the second side.

In an embodiment, the input copper busbar includes an insulating isolation layer disposed between the positive input copper busbar and the negative input copper busbar.

In an embodiment, the input copper busbar includes an insulating protection layer, and the positive input copper busbar, the insulating isolation layer and the negative electrode input copper busbar are arranged between the first elongated sidewall and the insulating protection layer.

In an embodiment, the input copper busbar further includes a fixing frame disposed on the first elongate sidewall and connected to the first side and the second side, respectively, the positive input copper busbar is electrically connected to a positive contact terminal of the first power module along the first side and electrically connected to a positive contact terminal of the second power module along the second side through the fixing frame, and the negative input copper busbar is electrically connected to a negative contact terminal of the first power module along the first side and electrically connected to a negative contact terminal of the second power module along the second side through the fixing frame.

In an embodiment, the two output copper busbars include a first output copper busbar and a second output copper busbar, and each of the first output copper busbar and the second output copper busbar includes an output terminal configured to abut against a load along a direction from the first side toward the second side to form an electrical connection with the load.

In an embodiment, the first power module includes a plurality of first power devices disposed on the first side and outputting through the first output copper busbar, and the second power module includes a plurality of second power devices disposed on the second side and outputting through the second output copper busbar, wherein the first output copper busbar and the second output copper busbar form a confluence output.

In an embodiment, the first power module includes a plurality of first power devices disposed on the first side and outputting through the first output copper busbar, and the second power module includes a plurality of second power devices disposed on the second side and outputting through the second output copper busbar. The first output copper busbar and the second output copper busbar form a shunt output.

In an embodiment, when the dual-inverter assembly is docked with the load, an elastic component provides the output terminal with an elastic force to push against the output terminal along a direction from the first side toward the second side, and the output terminal and the load are maintained to abut against each other.

In an embodiment, the second connection portion of the first output copper busbar is electrically connected to the first power module, and the second connection portion of the second output copper busbar is electrically connected to the second power module.

In an embodiment, the first power module includes a plurality of first power devices equidistantly disposed along the first direction, wherein the second power module includes a plurality of second power devices equidistantly disposed along the first direction.

In an embodiment, each of the plurality of first power devices and the plurality of second power devices includes a positive contact terminal, a negative contact terminal and the output contact terminal, the positive contact terminals and the negative contact terminals are spatially corresponding to the first elongated sidewall and electrically connected to the input copper busbar, the output contact terminals are spatially corresponding to the second elongated sidewall, the output contact terminals of the plurality of first power devices are electrically connected to the first output copper busbar, and the output contact terminals of the plurality of second power devices are electrically connected to the second output copper busbar.

In an embodiment, the elongated base includes a cooling flow channel, a cooling-flow-channel inlet and a cooling-flow-channel outlet, the cooling flow channel is disposed in the elongated base and thermally coupled to the first power module and the second power module, and the cooling-flow-channel inlet and the cooling-flow-channel outlet are disposed on the first side and in communication with the cooling flow channel.

In an embodiment, the dual-inverter assembly further includes a control board stacked on the first side of the elongated base, wherein a positive input port of the positive input copper busbar and a negative input port of the negative input copper busbar are extended along a surface of the control board.

In an embodiment, the dual-inverter assembly further includes a capacitor module stacked on the second side of the elongated base and located between output terminals of the two output copper busbars and the second side of the elongated base.

In an embodiment, the two output copper busbars include a first output copper busbar and a second output copper busbar, the output terminal of the first output copper busbar and a corresponding elastic component are arranged at a bottom projection position out of the first power module, the second power module and the capacitor module in the first direction, and the output terminal of the first output copper busbar and the output terminal of the second output copper busbar are arranged on the elongated base and parallel to the second side, wherein the dual-inverter assembly further comprises a control board disposed under the elastic component and extended obliquely to a bottom space of the first power module, and the input copper busbar is extended in a space above the control board and below the first power module.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
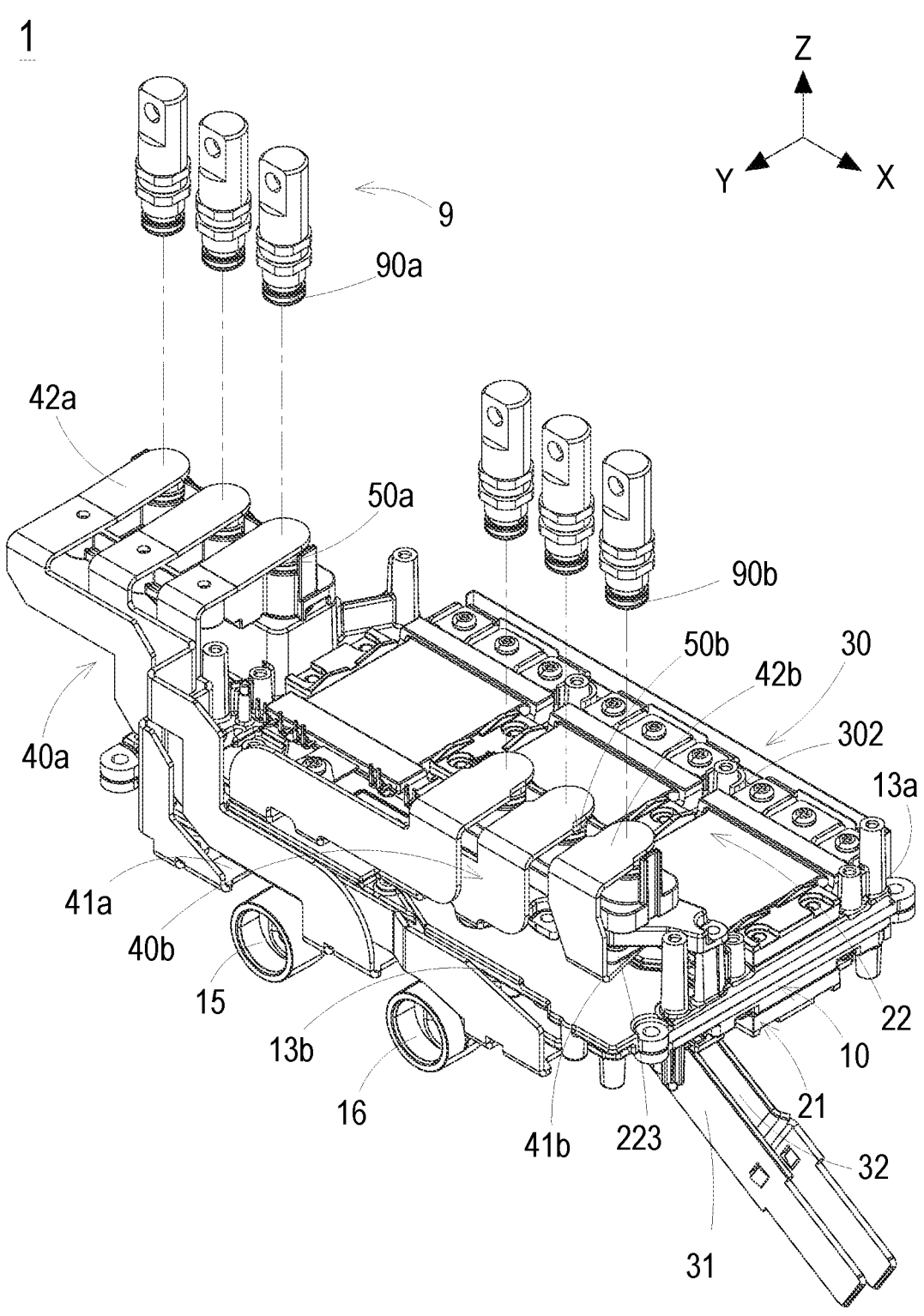
FIG. 1 is an appearance structural view illustrating a dual-inverter assembly according to an embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "front," "rear," "upper," "lower" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments.

Please refer to FIG. 1. In the embodiment, the present disclosure provides a dual-inverter assembly 1 including an elongated base 10, a first power module 21, a second power module 22, an input copper busbar 30 and two output copper busbars 40*a*, 40*b*. Preferably but not exclusively, in the embodiment, the first power module 21 and the second power module 22 are stacked up and down on the elongated base 10 in the Z axial direction. Preferably but not exclusive, the input copper busbar 30 is a DC input copper busbar, which is integrated from the bottom of the elongated base 10 to one elongated lateral side (i.e., the first elongated sidewall 13*a*) and then electrically connected to the first power module 21 and the second power module 22. In addition, the two output copper busbars 40*a*, 40*b* are two AC output copper busbars including a first output copper busbar 40*a* and a second output copper busbar 40*b*. In the embodiment, the first power module 21 is electrically connected to the first output copper busbar 40*a*, and the second power module 22 is electrically connected to the second output coper bar 40*b*. The two AC output copper busbars are electrically connected from another elongated lateral side (i.e., the second elongated sidewall 13*b*) to the first power module 21 and the second power module 22, respectively, and then led to the top of the elongated base 10 for integration. When the dual-inverter assembly 1 is docked to a load 9 along the Z axial direction, the first output copper busbar 40*a* and the second output copper busbar 40*b* are electrically connected to the contact terminals 90*a*, 90*b* of the load 9, respectively, so as to supply the power to the load 9. In other words, it allows to integrate elongated power modules in a limited space by a single-input and dual-output manner of the dual-inverter assembly 1 of the present disclosure, so as to improve the entire space utilization. Detailed features are further explained later.

Figure 2A:
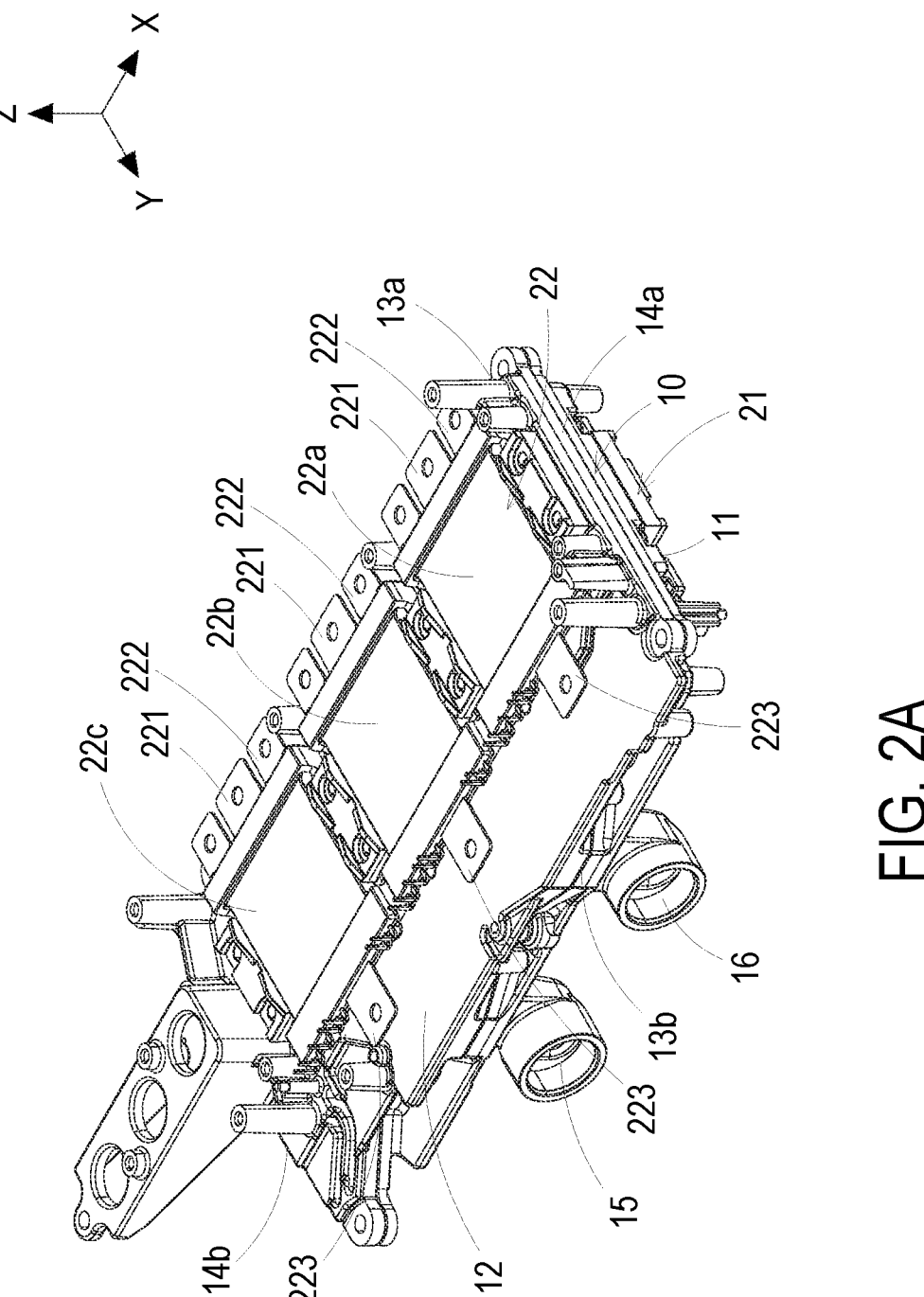
FIGS. 2A and 2B are perspective structural views illustrating the first power module and the second power module disposed on the elongated base of the dual-inverter assembly according to the embodiment of the present disclosure.
Figure 2B:
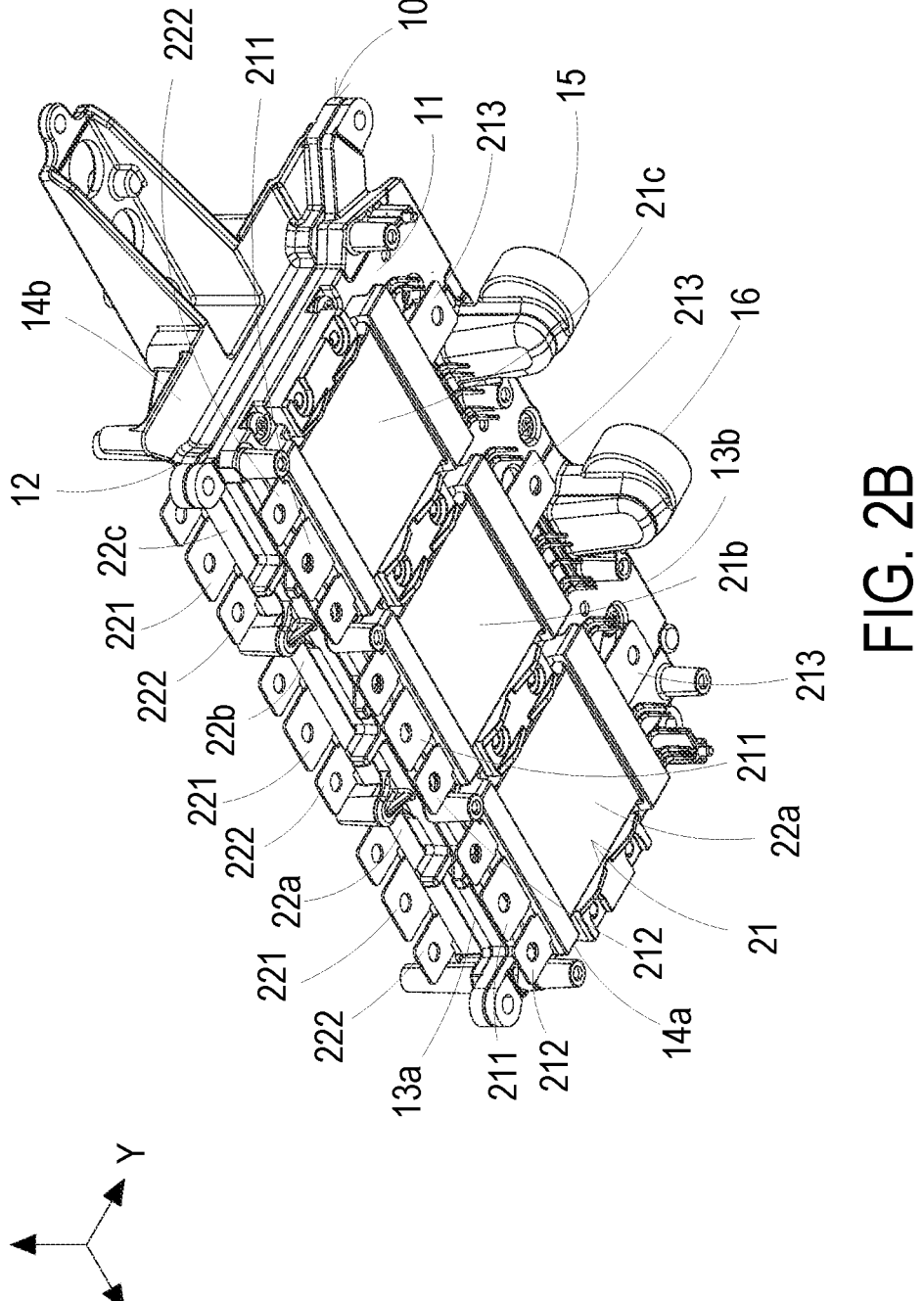
Figure 3:
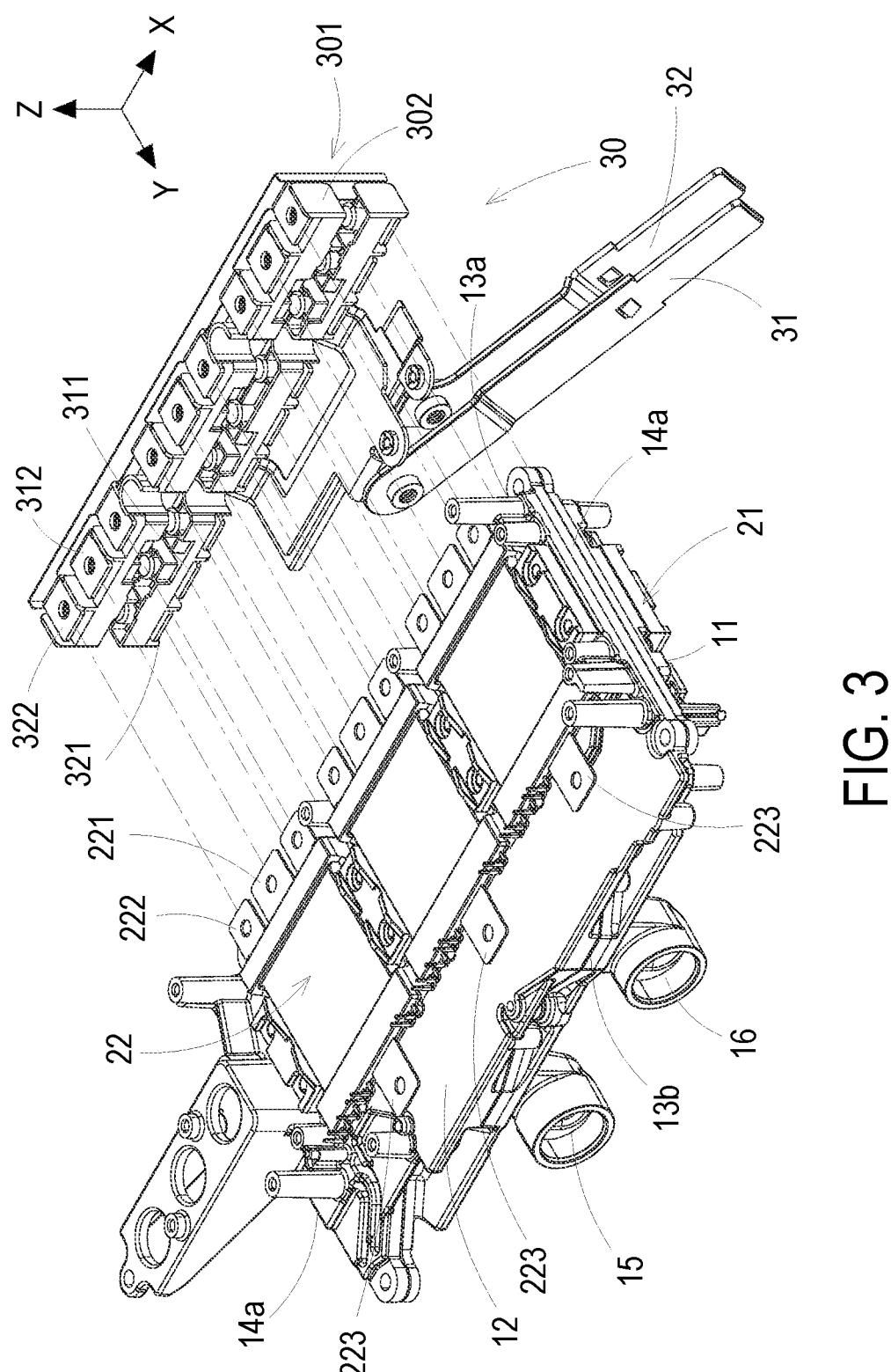
FIG. 3 is a perspective structural view illustrating the input copper busbar corresponding to the first power module and the second power module disposed on the elongated base of the dual-inverter assembly according to the embodiment of the present disclosure.
Figure 4:
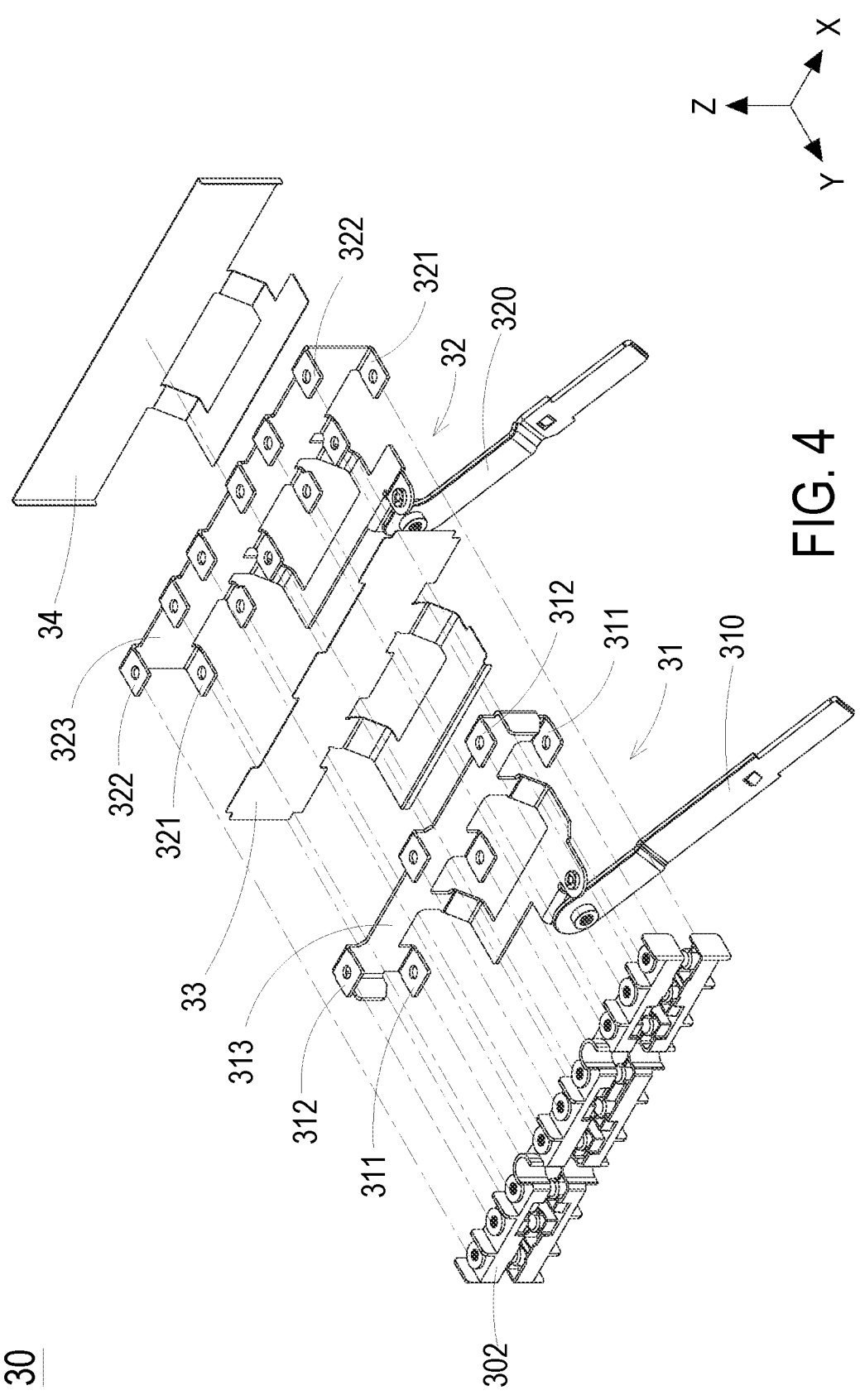
FIG. 4 is an exploded view illustrating the input copper busbar of the dual-inverter assembly according to the embodiment of the present disclosure.
Figure 5:
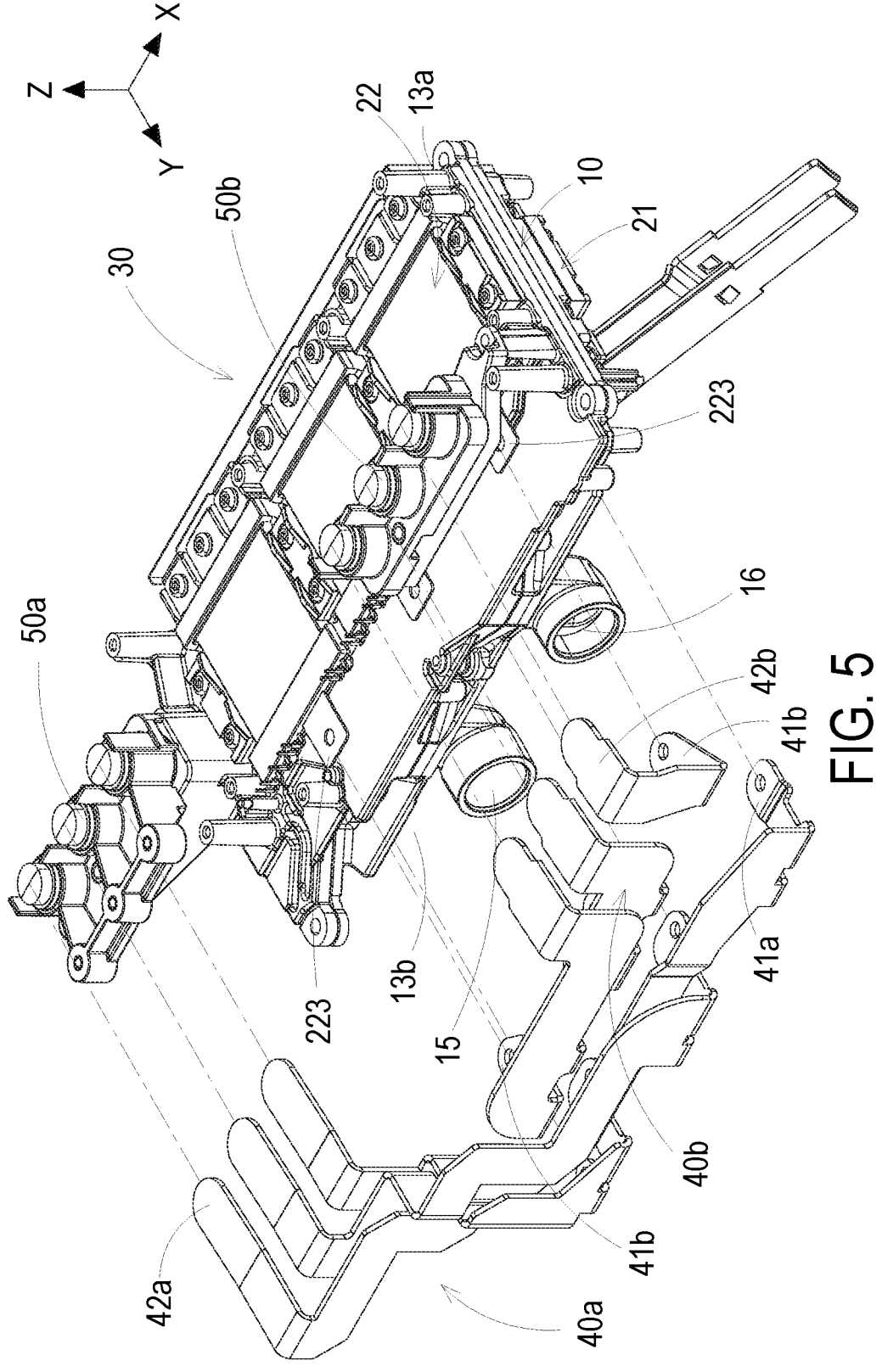
FIG. 5 is a perspective structural view illustrating the two output copper busbars corresponding to the first power module and the second power module disposed on the elongated base of the dual-inverter assembly according to the embodiment of the present disclosure.
Figure 6:
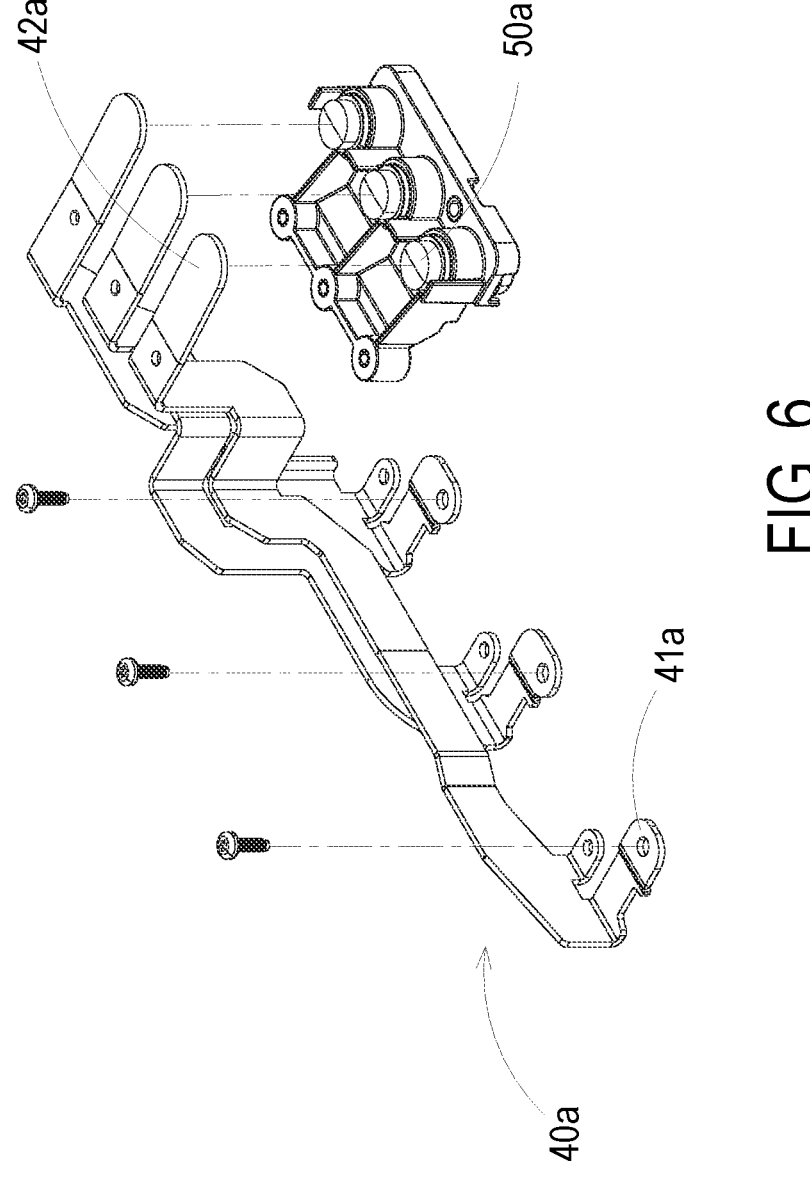
FIG. 6 is an exploded view showing the first output copper busbar of the dual-inverter assembly according to the present disclosure.
Figure 7:
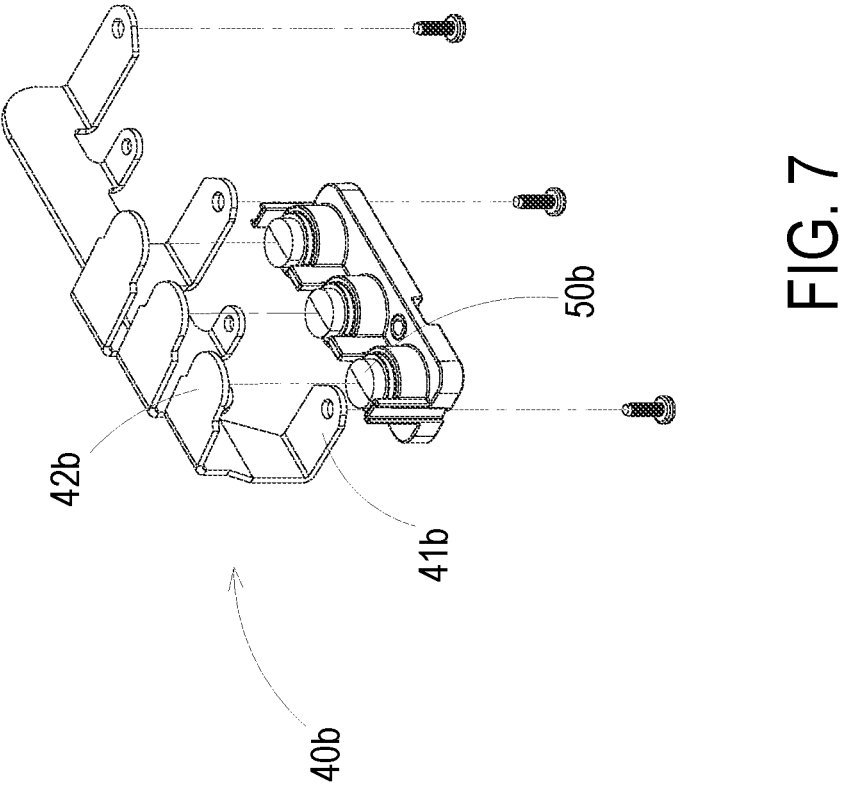
FIG. 7 is an exploded view showing the second output copper busbar of the dual-inverter assembly according to the present disclosure.

Please refer to FIG. 1, FIG. 2A and FIG. 2B. In the embodiment, the elongated base 10 includes a first side 11, a second side 12, a first elongated sidewall 13*a*, a second elongated sidewall 13*b*, a first shortened sidewall 14*a* and the second shortened sidewall 14*b*. The first side 11 and the second side 12 are opposite to each other. The first elongated sidewall 13*a* and the second elongated sidewall 13*b* are opposite to each other and extended along a first direction, such as the X axial direction. Moreover, the first side 11 and the second side 12 are connected to each other through the first elongated sidewall 13*a* and the second elongated sidewall 13*b*. In the embodiment, the first shortened sidewall 14*a* and the second shortened sidewall 14*b* are opposite to each other and extended along a second direction, such as the Y axial direction. Moreover, the first shortened sidewall 14a and the second shortened sidewall 14b are connected to the first elongated sidewall 13a and the second elongated sidewall 13b, respectively. In the embodiment, the elongated base 10 includes a cooling flow channel (not shown), a cooling-flow-channel inlet 15 and a cooling-flow-channel outlet 16. The cooling flow channel is disposed in the elongated base 10 and thermally coupled to the first power module 21 and the second power module 22. The cooling-flow-channel inlet 15 and the cooling-flow-channel outlet 16 are disposed on the first side 11 and in communication with the cooling flow channel. Moreover, the cooling-flow-channel inlet 15 and the cooling-flow-channel outlet 16 are lead out through the second elongated sidewall 13b. In this way, the heat generated by the first power module 21 and the second power module 22 can be taken away by the liquid coolant in the cooling flow channel for heat dissipation. In other embodiments, the cooling-flow-channel inlet 15 and the cooling-flow-channel outlet 16 are led out through the first shortened sidewall 14a, the second shortened sidewall 14b or the first elongated sidewall 13a. Certainly, the present disclosure is not limited thereto.

Preferably but not exclusive, in the embodiment, the first power module 21 include three first power devices 21a, 21b, 21c, which are equidistantly disposed along the first direction (i.e., the X axial direction) on the first side 11 of the elongated base 10. Preferably but not exclusively, the second power module 22 includes three second power devices 22a, 22b, 22c equidistantly disposed along the first direction (i.e., the X axial direction) on the second side 12 of the elongated base 10. The three first power devices 21a, 21b, 21c of the first power module 21 are configured to form one set of three-phase AC outputs through the first output copper busbar 40a. The three second power devices 22a, 22b, 22c of the second power module 22 are configured to form another set of three-phase AC outputs through the second output copper busbar 40b. Certainly, in other embodiments, the numbers and the spaced distance of the first power devices 21a, 21b, 21b of the first power module 21 the second power devices 22a, 22b, 22c of the second power module 22 are adjustable according to the practical requirements. The present disclosure is not limited thereto.

Notably, in the embodiment, each of the plurality of first power devices 21a, 21b, 21c includes a positive contact terminal 211, a negative contact terminal 212 and an output contact terminal 213. Each of the plurality of second power devices 22a, 22b, 22c includes a positive contact terminal 221, a negative contact terminal 222 and the output contact terminal 223. In the embodiment, the positive contact terminals 211, 221 and the negative contact terminals 212, 222 are spatially corresponding to the first elongated sidewall 13a and electrically connected to the input copper busbar 30. In the embodiment, the output contact terminals 213, 223 are spatially corresponding to the second elongated sidewall 13b. The output contact terminals 213 of the plurality of first power devices 21a, 21b, 21c are electrically connected to the first output copper busbar 40a. Moreover, the output contact terminals 223 of the plurality of second power devices 22a, 22b, 22c are electrically connected to the second output copper busbar 40b. In other words, the first power module 21 and the second power module 22 are electrically connected to the input copper busbar 30 through the first elongated sidewall 13a, and are electrically connected to the first output copper busbar 40a and the second output copper busbar 40b through the second elongated sidewall 13b. In that, the electrical connection of single-input and dual-output configuration is achieved on different lateral sides of the elongated base 10.

Figure 8:
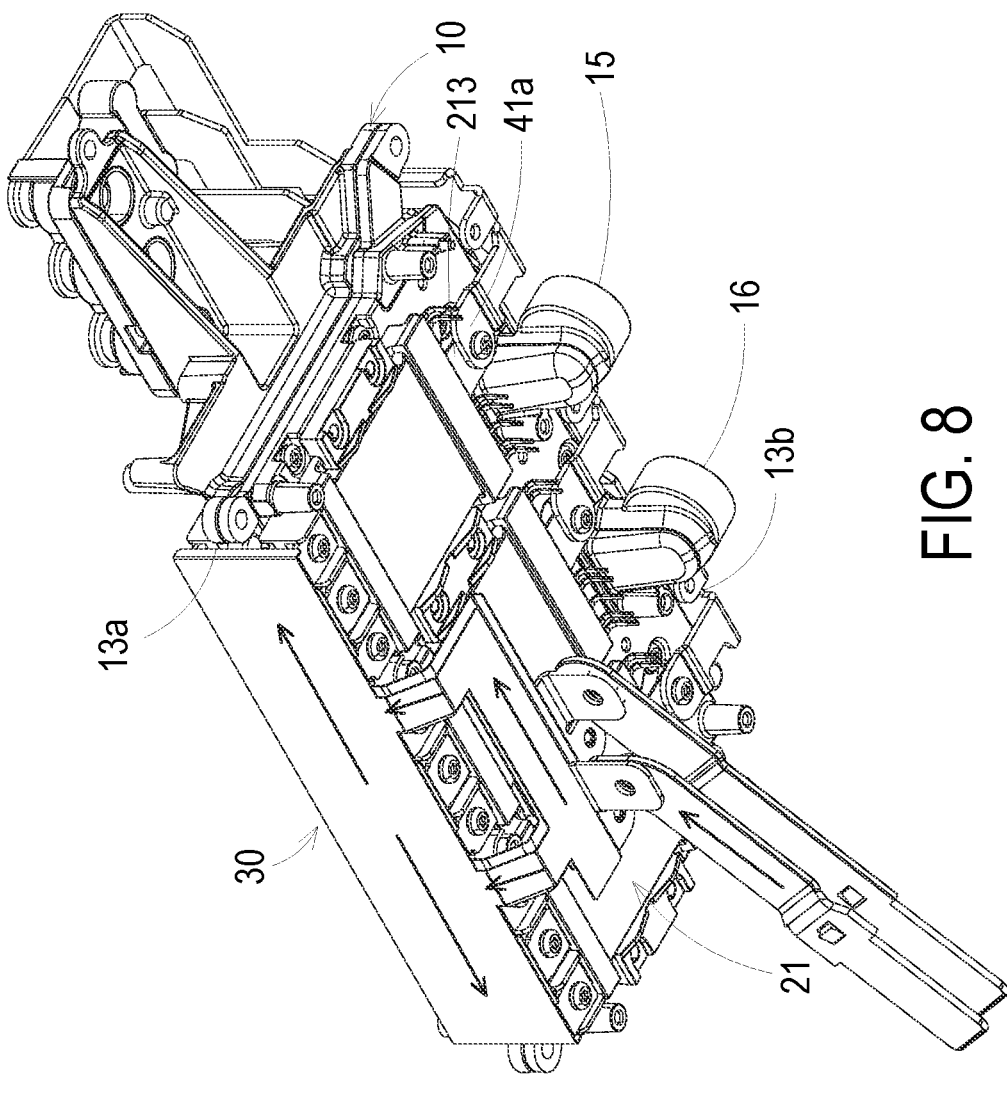
FIG. 8 is a schematic diagram showing the current conduction direction of the input copper busbar of the dual-inverter assembly according the embodiment of the present disclosure.
Figure 8:
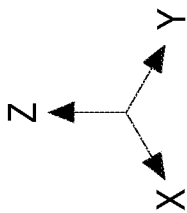

Please refer to FIG. 1 to FIG. 4. In the embodiment, the input copper busbar 30 is spatially corresponding to the first elongated sidewall 13a, and includes a first connection portion 301 disposed on the first elongated sidewall 13a. The input copper busbar 30 is electrically connected to the first power module 21 and the second power module 22. In the embodiment, the input copper busbar 30 is a DC input copper busbar, and includes a positive input copper busbar 31 and a negative input copper busbar 32, which are spatially corresponding to the first elongated sidewall 13a. In the embodiment, the positive input copper busbar 31 includes a plurality of positive input connection pins 311, 312, and a positive attaching section 313. The plurality of positive input connection pins 311 are spatially corresponding to the first side 11 and configured to connect the positive contact terminals 211 of the first power module 21. The plurality of positive input connection pins 312 are spatially corresponding to the second side 12 and configured to connect the positive contact terminals 221 of the second power module 22. The plurality of positive input connection pins 311 and the plurality of positive input connection pins 312 are connected in parallel through the positive attaching section 313, and electrically connected to the first power module 21 and the second power module 22. In the embodiment, the negative input copper busbar 32 includes a plurality of negative input connection pins 321, 322, and a negative attaching section 323. The plurality of negative input connection pins 321 are spatially corresponding to the first side 11 and configured to connect the negative contact terminals 212 of the first power module 21. The plurality of negative input connection pins 322 are spatially corresponding to the second side 12 and configured to connect the negative contact terminals 222 of the second power module 22. The plurality of negative input connection pins 321 and the plurality of negative input connection pins 322 are connected in parallel through the negative attaching section 323, and electrically connected to the first power module 21 and the second power module 22. In the embodiment, the positive attaching section 313 and the negative attaching section 323 are spatially parallel to the first elongated sidewall 13a. In the embodiment, the input copper busbar 30 further includes an insulating isolation layer 33 disposed between the positive attaching section 313 of the positive input copper busbar 31 and the negative attaching section 323 of the negative input copper busbar 32. Moreover, in the embodiment, the plurality of positive input connection pins 311 and the plurality of negative input connection pins 321 connected to the first power module 21 are misaligned with each other in a view direction (i.e., the Z axial direction) from the first side 11 to the second side 12. The plurality of positive input connection pins 312 and the plurality of negative input connection pins 322 connected to the second power module 22 are misaligned with each other in the viewing direction (the Z axial direction) from the first side 11 to the second side 12. In the embodiment, the plurality of positive input connection pins 311, 312 and the plurality of negative input connection pins 321, 322 are further fixed to a fixing frame 302 by screws and then fastened to the first elongated sidewall 13a. In the embodiment, the fixing frame 302 is disposed on the first elongate sidewall 13a and connected to the first side 11 and the second side 12, respectively, so as to support the structures of the positive input copper busbar 31 and the negative input copper busbar 32. In the embodiment, the positive input copper busbar 31 is electrically connected to the positive contact terminal 211 of the first power module 21 along the first side 11 and electrically connected to the positive contact terminal 221 of the second power module 22 along the second side 12 through the fixing frame 302. Moreover, the negative input copper busbar 32 is electrically connected to the negative contact terminal 212 of the first power module 21 along the first side 11 and electrically connected to the negative contact terminal 222 of the second power module 22 along the second side 12 through the fixing frame 302. Certainly, the present disclosure is not limited thereto. In the embodiment, the input copper busbar 30 further includes an insulating protection layer 34. Preferably but not exclusively, the positive input copper busbar 31, the insulating isolation layer 33 and the negative electrode input copper busbar 32 are arranged between the fixing frame 302 disposed on the first elongated sidewall 13a and the insulating protection layer 34, so as to be protected therebetween through the insulating protection layer 34. On the other hand, in the embodiment, he positive input copper busbar 31 further includes a positive input port 310 connected to the positive attaching section 313, and the negative input copper busbar 32 further includes a negative input port 320 connected to the negative attaching section 320. Moreover, the positive input port 310 and the negative input port 320 are arranged in parallel to each other. Thereby, one single set of DC input copper busbars 30 is integrated from the bottom of the elongated base 10 to the first elongated sidewall 13a and then electrically connected to the first power module 21 and the second power module 22. In the embodiment, the input-current conduction direction of one single set of DC input copper busbars 30 is shown in FIG. 8. The current is introduced from the first side 11 below the elongated base 10 and then conducted to the first power module 21 and the second power module 22 through the first elongated sidewall 13a, respectively.

Please refer to FIG. 1, FIG. 2A, FIG. 2B and FIG. 5 to FIG. 7. In the embodiment, the first output copper busbar 40a includes a second connection portion 41a and an output terminal 42a. The second connection portion 41a of the first output copper busbar 40a is electrically connected to the output contact terminal 213 of the first power module 21 along the first side 11. Preferably but not exclusively, the second connection portion 41a of the first output copper busbar 40a and the output contact terminal 213 of the first power module 21 are be fixed to the first side 11 by the screw, so as to form an electrical connection. The output terminal 42a is configured to abut against the contact terminal 90a of the load 9 along the direction (i.e., the Z axial direction) from the first side 11 to the second side 12, so as to form an electrical connection. In the embodiment, the second output copper busbar 40b includes a second connection portion 41b and an output terminal 42b. The second connection portion 41b of the first output copper busbar 40b is electrically connected to the output contact terminal 223 of the second power module 22 along the second side 12. Preferably but not exclusively, the second connection portion 41b of the second output copper busbar 40b and the output contact terminal 223 of the second power module 21 are be fixed to the second side 11 by the screw, so as to form an electrical connection. In other embodiments, the second connection portions 41a, 41b of the two output copper busbars 40a, 40b are connected to the output contact terminal 213 of the first power module 21 and the output contact terminal 223 of the second power module 22 through laser welding technology. The present disclosure is not limited thereto. In the embodiment, the output terminal

Figure 9:
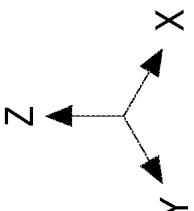
FIG. 9 is a schematic diagram showing the current conduction direction of the two output copper busbars of the dual-inverter assembly according the embodiment of the present disclosure.

42b is configured to abut against the contact terminal 90b of the load 9 along the direction (i.e., the Z axial direction) from the first side 11 to the second side 12, so as to form an electrical connection. Notably, the first output copper busbar 40a and the second output copper busbar 40b are two sets of output copper busbars, which are independently connected to the load 9 for operation without interfering with each other. In the embodiment, when the dual-inverter assembly 1 is docked with the load 9, an elastic component 50a provides the output terminal 42a of the first output copper busbar 40a with an elastic force to push against the output terminal 42a along a direction from the first side 11 toward the second side 12, so that the output terminal 42a and the contact terminal 90a of the load 9 are maintained to abut against each other. Similarly, when the dual-inverter assembly 1 is docked with the load 9, another elastic component 50b provides the output terminal 42b of the second output copper busbar 40b with an elastic force to push against the output terminal 42b along the direction from the first side 11 toward the second side 12, so that the output terminal 42b and the contact terminal 90b of the load 9 are maintained to abut against each other. In this way, two sets of the first output copper busbar 40a and the second output copper busbar 40b are AC independent outputs, and the outputs of the first power module 21 and the second power module 22 are led out through the second elongated sidewall 13b of the elongated base 10 and integrated above the elongated base 10, respectively. In this way, when the dual-inverter assembly 1 is docked to the load 9 along the Z axial direction, an electrical connection is achieved. In the embodiment, the output-current conduction directions of the first output copper busbar 40a and the second output copper busbar 40b of the two sets of AC outputs are shown in FIG. 9. The outputs of the first power module 21 and the second power module 22 are led out through the second elongated sidewall 13b of the elongated base 10, and then integrated to the top of the second side 12 of the elongated base 10.

In the embodiment, the first power module 21 includes a plurality of first power devices 21a, 21b, 21c, which are disposed on the first side 11 and output through the first output copper busbar 40a. Moreover, the second power module 22 includes a plurality of second power devices 22a, 22b, 22c, which are disposed on the second side (12) and output through the second output copper busbar 40b. Preferably but not exclusively, in an embodiment, the first output copper busbar 40a and the second output copper busbar 40b form a confluence output. In another embodiment, the first output copper busbar 40a and the second output copper busbar 40b form a shunt output.

From the above, the elongated base 10, the first power module 21 and the second power module 22 are vertically stacked along the Z axial direction. Furthermore, one single DC input of the input copper busbar 30 and dual AC outputs of the first output copper busbar 40a and the second output copper busbar 40b are corresponding to the first elongated sidewall 13a and the second elongated sidewall 13b on the elongated base 10, respectively. In that, the dual-inverter assembly 1 with lower input and upper output is achieved. When the first power module 21 and the second power module 22 increase the numbers of the first power devices 21a, 21b, 21c and the second power devices 22a, 22b, 22c according to the practical requirements the dual-inverter assembly 1 only needs to increase the corresponding lengths of the first elongated sidewall 13a and the second elongated sidewall 13b along the first direction. Certainly, the numbers of the single DC input of the input copper busbars 30 and the dual AC outputs of the first output copper busbars 40a and the second output copper busbars 40*b* are adjustable according to the practical requirements. In addition, the extension of the dual-inverter assembly 1 along the first direction (i.e., the X axial direction) can be realized by changing the lengths of the first elongated sidewall 13*a* and the second elongated sidewall 13*b*. In order to achieve the height limitation in the stacking direction (i.e., the Z axial direction), it allows to change the configuration of the elongated base 10, the first power module 21, the second power module 22, the positive input port 310, the negative input port 320, the output terminals 42*a*, 42*b* and the elastic components 50*a* 50*b*. Certainly, many of the aforementioned technical features are adjustable and combined according to the practical requirements. The present disclosure is not limited thereto.

Figure 10:
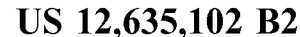
FIG. 10 is an exploded view illustrating a dual-inverter assembly according to another embodiment of the present disclosure.
Figure 11:
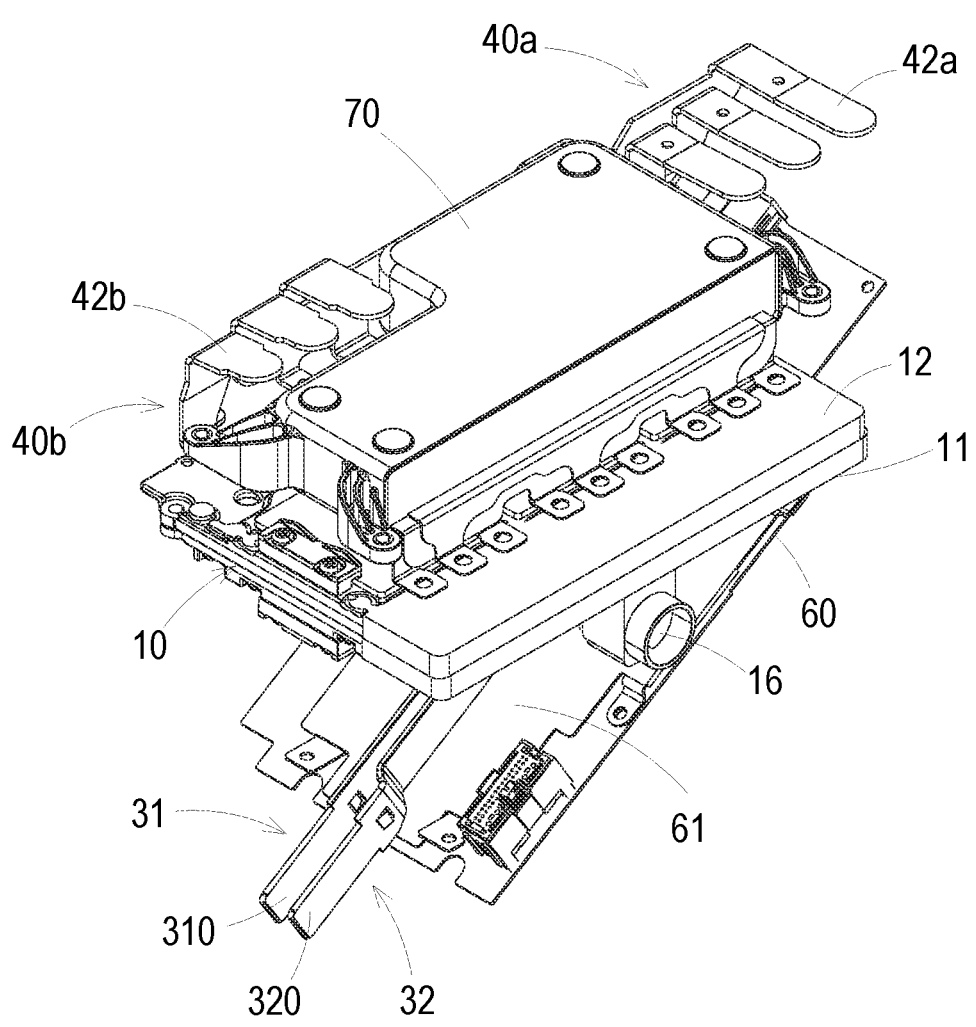
FIG. 11 is an appearance structural view illustrating the dual-inverter assembly in FIG. 10.
Figure 12:
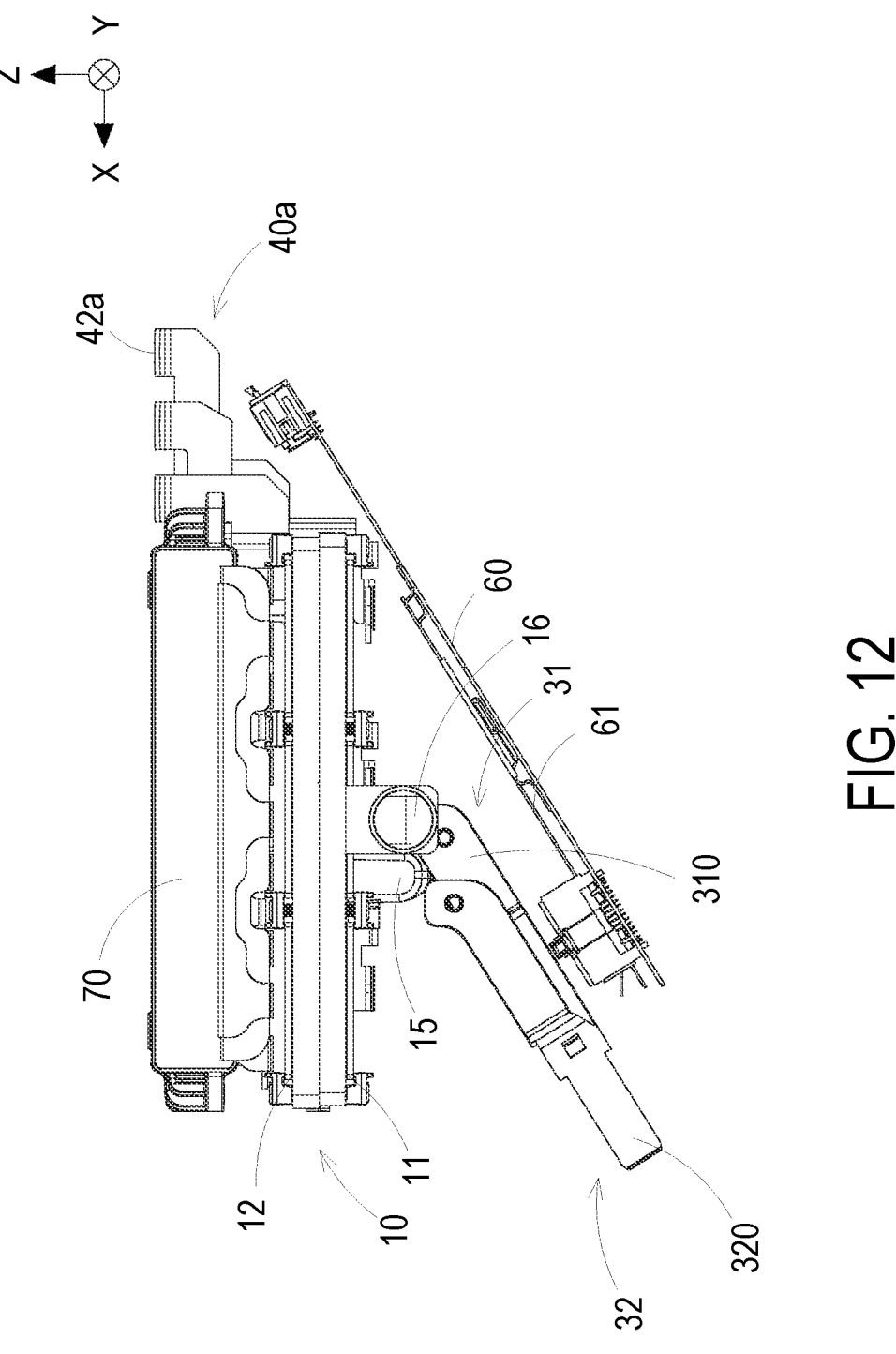
FIG. 12 is a lateral view illustrating the dual-inverter assembly in FIG. 11.

FIG. 10 to FIG. 12 show a dual-inverter assembly 1*a* according to another embodiment of the present disclosure. In the embodiment, the structures, elements and functions of the dual-inverter assembly 1*a* are similar to those of the dual-inverter assembly 1 of FIG. 1 to FIG. 8, and are not redundantly described herein. In the embodiment, the illustration of the first power module 21 and the second power module 22 is omitted for the convenience of explaining the space utilization of the dual inverter assembly 1*a*. It is not intended to limit the present disclosure, so it is explained first. Furthermore, the relevant arrangements of the first power module 21 and the second power module 22, the corresponding to the elongated base 10, the input copper busbar 30, and the two output copper busbars 40*a*, 40*b* can be referred to in FIG. 1 to FIG. 8 Notably, in the embodiment, the positive input port 310 and the negative input port 320 of the input copper busbar 30 occupy a partial space below the first side 11 of the elongated base 10, and the angle of the downward lead-out is adjustable according to the practical requirements, so as to improve the space utilization. In the embodiment, the dual-inverter assembly 1*a* further includes a control board 60, which is stacked on the first side 11 of the elongated base 10. That is, the control board 60 is disposed below the elongated base 10. In order to obtain the maximum utilization space of the dual-inverter assembly 1*a*, the control board 60 can for example to be arranged along a vehicle fixing frame (not shown) or a housing (not shown) covering the dual-inverter assembly structure 1, and the positive input port 310 and the negative input port 320 of the input copper busbar 30 are extended along a surface of the control board 60, so as to achieve the most compact structure. Certainly, in order to obtain the most compact structure, the cooling-flow-channel inlet 15 and the cooling-flow-channel outlet 16 of the elongated base 10 can be led out through the first side 11 of the elongated base 10, and avoid the control board 60, the positive input port 310 of the positive input copper busbar 31 and the negative input port 320 of the negative input copper busbar 32 at the same time. The present disclosure is not limited thereto. On the other hand, the dual-inverter assembly 1*a* further includes a capacitor module 70 stacked on the second side 12 of the elongated base 10 and located between the output terminals 42*a* of the first output copper busbar and the second side 12 of the elongated base 10, and locked between the output terminals 42*b* of the second output copper busbar 40*b* and the second side 12 of the elongated base 10. The operations of the output terminals 42*a*, 42*b* and the contact terminals 90*a*, 90*b* of the load 9 are not affected. When the dual-inverter assembly 1*a* is docked with the load 9, the output terminals 42*a*, 42*b* are electrically connected to the contact terminals 90*a*, 90*b* synchronously through the action of the elastic components 50*a*, 50*b* (Referring to FIG. 1).

Certainly, the arrangements of the output terminals 42*a*, 42*b* and the elastic components 50*a*, 50*b* are adjustable according to the configuration of the contact terminals 90*a*, 90*b* and the avoidance of the capacitor module 70, so as to achieve the purpose of a compact structure. In addition, the capacitor module 70 located on the second side 12 of the elongated base 10 is further corresponding to the first power devices 21*a*, 21*b*, 21*c* of the first power module 21 and the second power device 22*a*, 22*b*, 22*c* of the second power module 22, so as to form a consistent conduction distance and minimize the conduction distance (Referring to FIG. 1).

Moreover, in the embodiment, the output terminal 42*a* of the first output copper busbar 40*a* and the corresponding elastic component 50*a* are arranged at a bottom projection position (along the Z axial direction), which is out of the first power module 21, the second power module 22 and the capacitor module 70 in the first direction. In other words, the output terminal 42*a* of the first output copper busbar 40*a*, the corresponding elastic component 50*a*, and the contact terminals 90*a* are misaligned to the first power module 21, the second power module 22 and the capacitor module 70 in the viewing direction of the Z axis. Moreover, in the embodiment, the output terminal 42*a* of the first output copper busbar 40*a* and the output terminal 42*b* of the second output copper busbar 40*b* are correspondingly arranged on the elongated base 10, and the top portion of the capacitor module 70 is lower than the bottom portion of the contact terminals 90*a*, 90*b*. In an embodiment, when the output terminal 42*a* of the first output copper busbar 40*a* and the output terminal 42*b* of the second output copper busbar 40*b* are correspondingly arranged on the elongated base 10 and located at one plane parallel to the second side 12. In addition, the control board 60 is disposed under the elastic component 50*a* corresponding to the first output copper busbar 40*a* and extended obliquely to a bottom space of the first power module 21. Furthermore, the positive input port 310 of the positive input copper busbar 31 and the negative input port 320 of the negative input copper busbar 32 are extended in a space above the control board 60 and below the first power module 21, so as to obtain the most compact structure. In this way, the dual-inverter assembly 1*a* achieve an optimal configuration in a limited space by a single-input and dual-output manner, and the entire space utilization is improved. Certainly, the present disclosure is not limited thereto and not redundantly describe hereafter.

In summary, the present disclosure provides a dual-inverter assembly integrating elongated power modules in a limited space by a single-input and dual-output manner, so as to improve the entire space utilization. Preferably, two power modules are stacked up and down on an elongated base, one DC input copper busbar is integrated from the bottom to one elongated sidewall and then electrically connected to the two power modules, and two AC output copper busbars are electrically connected from another elongated sidewall to the two power modules, respectively, and then led to the top for integration. It facilitates to integrate the utilization of the upper and lower spaces of the stacked structure effectively. When a bulk capacitor is stacked above the dual-inverter assembly, it allows to minimize the distance between the bulk capacitor and the two power modules, and make the distances from the bulk capacitor to the power devices of each power module as consistent as possible. The cooling flow channel disposed in the interior of the elongated base has the inlet and the outlet leading through the lower space, and serves as a cooling structure for two power modules and the bulk capacitors. The two AC output copper busbars, which are limited by the connection direction of the load end, have the respective elastic component disposed thereof to provide the appropriate elastic force to keep the output copper busbars firmly in contact with the load. On the other hand, it allows to arrange the control circuit board for the dual-inverter assembly under the assembly structure to take full advantage of the lower space. Thus, it facilitates the dual-inverter assembly to achieve an optimal configuration in a limited space by a single-input and dual-output manner, and the entire space utilization is improved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A dual-inverter assembly comprising:
an elongated base comprising a first side, a second side, a first elongated sidewall and a second elongated sidewall, wherein the first side and the second side are opposite to each other, and the first elongated sidewall and the second elongated sidewall are opposite to each other and extended along a first direction;
a first power module arranged along the first direction and disposed on the first side;
a second power module arranged along the first direction and disposed on the second side;
an input copper busbar spatially corresponding to the first elongated sidewall, partially extended toward the first side and the second side from the first elongated sidewall, and comprising a first connection portion disposed on the first elongated sidewall and electrically connected to the first power module and the second power module, wherein the input copper busbar is a DC input copper busbar comprising a positive input copper busbar and a negative input copper busbar, which are spatially corresponding to the first elongated sidewall; and
two output copper busbars spatially corresponding to the second elongated sidewall and partially extended toward the first side and the second side from the second elongated sidewall, wherein the two output copper busbars are served as two AC output copper busbars, each of the two output copper busbars comprises a second connection portion disposed adjacent to the second elongated sidewall, one of the second connection portion of the two output copper busbars is electrically connected to an output contact terminal of the first power module along the first side, and another one of the second connection portion of the two output copper busbars is electrically connected to an output contact terminal of the second power module along the second side, wherein the first power module comprises a plurality of first power devices arranged along the first direction and disposed on the first side, and the second power module comprises a plurality of second power devices arranged along the first direction and disposed on the second side.

2. The dual-inverter assembly according to claim 1, wherein the positive input copper busbar comprises a positive attaching section, the negative input copper busbar comprises a negative attaching section, and the positive attaching section and the negative attaching section are spatially parallel to the first elongated sidewall.

3. The dual-inverter assembly according to claim 2, wherein the positive input copper busbar comprises a positive input port connected to the positive attaching section, the negative input copper busbar comprises a negative input port connected to the negative attaching section, and the positive input port and the negative input port are arranged in parallel to each other.

4. The dual-inverter assembly according to claim 3, wherein the positive input copper busbar comprises a plurality of positive input connection pins spatially corresponding to the first side and the second side, connected in parallel through the positive attaching section, and electrically connected to the first power module and the second power module.

5. The dual-inverter assembly according to claim 4, wherein the negative input copper busbar comprises a plurality of negative input connection pins, spatially corresponding to the first side and the second side, connected in parallel through the negative attaching section, and electrically connected to the first power module and the second power module.

6. The dual-inverter assembly according to claim 5, wherein the plurality of positive input connection pins and the plurality of negative input connection pins are misaligned with each other in a viewing direction from the first side to the second side.

7. The dual-inverter assembly according to claim 1, wherein the input copper busbar comprises an insulating isolation layer disposed between the positive input copper busbar and the negative input copper busbar.

8. The dual-inverter assembly according to claim 7, wherein the input copper busbar comprises an insulating protection layer, and the positive input copper busbar, the insulating isolation layer and the negative electrode input copper busbar are arranged between the first elongated sidewall and the insulating protection layer.

9. The dual-inverter assembly according to claim 1, wherein the input copper busbar further comprises a fixing frame disposed on the first elongate sidewall and connected to the first side and the second side, respectively, the positive input copper busbar is electrically connected to a positive contact terminal of the first power module along the first side and electrically connected to a positive contact terminal of the second power module along the second side through the fixing frame, and the negative input copper busbar is electrically connected to a negative contact terminal of the first power module along the first side and electrically connected to a negative contact terminal of the second power module along the second side through the fixing frame.

10. The dual-inverter assembly according to claim 1, wherein the two output copper busbars comprise a first output copper busbar and a second output copper busbar, and each of the first output copper busbar and the second output copper busbar comprises an output terminal configured to abut against a load along a direction from the first side toward the second side to form an electrical connection with the load.

11. The dual-inverter assembly according to claim 10, wherein the plurality of first power devices output through the first output copper busbar, and the plurality of second power devices output through the second output copper busbar, wherein the first output copper busbar and the second output copper busbar form a confluence output.

12. The dual-inverter assembly according to claim 10, wherein the plurality of first power devices output through the first output copper busbar, and the plurality of second power devices output through the second output copper busbar, wherein the first output copper busbar and the second output copper busbar form a shunt output.

13. The dual-inverter assembly according to claim 10, wherein when the dual-inverter assembly is docked with the load, an elastic component provides the output terminal with an elastic force to push against the output terminal along a direction from the first side toward the second side, and the output terminal and the load are maintained to abut against each other.

14. The dual-inverter assembly according to claim 10, wherein the second connection portion of the first output copper busbar is electrically connected to the first power module, and the second connection portion of the second output copper busbar is electrically connected to the second power module.

15. The dual-inverter assembly according to claim 10, wherein the plurality of first power devices are equidistantly disposed along the first direction, wherein the plurality of second power devices are equidistantly disposed along the first direction.

16. The dual-inverter assembly according to claim 15, wherein each of the plurality of first power devices and the plurality of second power devices comprises a positive contact terminal, a negative contact terminal and the output contact terminal, the positive contact terminals and the negative contact terminals are spatially corresponding to the first elongated sidewall and electrically connected to the input copper busbar, the output contact terminals are spatially corresponding to the second elongated sidewall, the output contact terminals of the plurality of first power devices are electrically connected to the first output copper busbar, and the output contact terminals of the plurality of second power devices are electrically connected to the second output copper busbar.

17. The dual-inverter assembly according to claim 1, wherein the elongated base comprises a cooling flow channel, a cooling-flow-channel inlet and a cooling-flow-channel outlet, the cooling flow channel is disposed in the elongated base and thermally coupled to the first power module and the second power module, and the cooling-flow-channel inlet and the cooling-flow-channel outlet are disposed on the first side and in communication with the cooling flow channel.

18. The dual-inverter assembly according to claim 1, further comprising a control board stacked on the first side of the elongated base, wherein a positive input port of the positive input copper busbar and a negative input port of the negative input copper busbar are extended along a surface of the control board.

19. The dual-inverter assembly according to claim 1, further comprising a capacitor module stacked on the second side of the elongated base and located between output terminals of the two output copper busbars and the second side of the elongated base.

20. The dual-inverter assembly according to claim 19, wherein the two output copper busbars comprise a first output copper busbar and a second output copper busbar, the output terminal of the first output copper busbar and a corresponding elastic component are arranged at a bottom projection position out of the first power module, the second power module and the capacitor module in the first direction, and the output terminal of the first output copper busbar and the output terminal of the second output copper busbar are arranged on the elongated base and parallel to the second side, wherein the dual-inverter assembly further comprises a control board disposed under the elastic component and extended obliquely to a bottom space of the first power module, and the input copper busbar is extended in a space above the control board and below the first power module.

* * * * *